(12) United States Patent
Miller (10) Patent No.: US 8,747,947 B2
(45) Date of Patent: Jun. 10, 2014

(54) GRAPHENE DEFECT ALTERATION

(75) Inventor: Seth Miller, Englewood, CO (US)

(73) Assignee: Empire Technology Development, LLC, Wilmington, DE (US)

( * ) Notice: Subject to any disclaimer, the term of this patent is extended or adjusted under 35 U.S.C. 154(b) by 276 days.

(21) Appl. No.: 13/377,971

(22) PCT Filed: Sep. 16, 2011

(86) PCT No.: PCT/US2011/051870
§ 371 (c)(1),
(2), (4) Date: Dec. 13, 2011

(87) PCT Pub. No.: WO2013/039506
PCT Pub. Date: Mar. 21, 2013

(65) Prior Publication Data
US 2013/0071564 A1 Mar. 21, 2013

(51) Int. Cl.
*C23C 16/30* (2006.01)
*C23C 16/56* (2006.01)
*B82Y 40/00* (2011.01)

(52) U.S. Cl.
USPC .............. 427/249.1; 427/255.34; 427/255.38; 427/255.7

(58) Field of Classification Search
USPC .................. 427/249.1, 255.34, 255.38, 255.7
See application file for complete search history.

(56) References Cited

U.S. PATENT DOCUMENTS

| | | | |
|---|---|---|---|
| 2007/0157870 A1* | 7/2007 | Hourai et al. | 117/13 |
| 2009/0291270 A1* | 11/2009 | Zettl et al. | 428/195.1 |
| 2010/0105834 A1 | 4/2010 | Tour et al. | |
| 2010/0218801 A1* | 9/2010 | Sung et al. | 136/244 |
| 2011/0017585 A1 | 1/2011 | Zhamu | |
| 2011/0041980 A1 | 2/2011 | Kim et al. | |
| 2011/0052813 A1 | 3/2011 | Ho et al. | |

(Continued)

FOREIGN PATENT DOCUMENTS

| JP | 2011-105569 A | 6/2011 |
|---|---|---|
| JP | 2011178617 A | 9/2011 |

(Continued)

OTHER PUBLICATIONS

Ghosh, S., et al., "Extremely high thermal conductivity of graphene: Prospects for thermal management applications in nanoelectronic circuits". Applied Physics Letters 92, 151911 (2008), pp. 1-3.*

(Continued)

*Primary Examiner* — Bret Chen
(74) *Attorney, Agent, or Firm* — Moritt Hock & Hamroff LLP; Steven S. Rubin, Esq.

(57) ABSTRACT

Technologies are generally described for a method and system configured effective to alter a defect area in a layer on a substrate including graphene. An example method may include receiving and heating the layer to produce a heated layer and exposing the heated layer to a first gas to produce a first exposed layer, where the first gas may include an amine. The method may further include exposing the first exposed layer to a first inert gas to produce a second exposed layer and exposing the second exposed layer to a second gas to produce a third exposed layer where the second gas may include an alane or a borane. Exposure of the second exposed layer to the second gas may at least partially alter the defect area.

12 Claims, 4 Drawing Sheets

(56) References Cited

U.S. PATENT DOCUMENTS

| | | | |
|---|---|---|---|
| 2011/0084252 A1 | 4/2011 | Wu et al. | |
| 2011/0092054 A1* | 4/2011 | Seo et al. | 438/473 |
| 2011/0104442 A1* | 5/2011 | Yoon et al. | 428/152 |
| 2011/0104507 A1* | 5/2011 | Choi et al. | 428/500 |
| 2011/0135884 A1* | 6/2011 | Lettow et al. | 428/174 |
| 2011/0143034 A1 | 6/2011 | Ahn et al. | |
| 2011/0143045 A1* | 6/2011 | Veerasamy | 427/495 |
| 2011/0186806 A1 | 8/2011 | Bowers et al. | |
| 2012/0003438 A1* | 1/2012 | Appleton et al. | 428/195.1 |
| 2013/0071616 A1* | 3/2013 | Miller et al. | 428/138 |
| 2013/0230722 A1* | 9/2013 | Fujii et al. | 428/408 |
| 2013/0292161 A1* | 11/2013 | Liu et al. | 174/257 |

FOREIGN PATENT DOCUMENTS

| | | |
|---|---|---|
| WO | 2008/048192 A1 | 4/2008 |
| WO | 2009/089391 A2 | 7/2009 |
| WO | 2010/001123 A1 | 7/2010 |

OTHER PUBLICATIONS

Carr, Lincoln, D., et al., "Graphene gets designer defects". Nature Nanotechnology, vol. 5, May 2010, pp. 316-317.*

Sungjin Park and Rodney S. Ruoff, Chemical Methods for the Production of Graphenes, Nature Nanotechnology, vol. 4, Apr. 2009, 217-224.

Bagri et al., Structural Revolution During the Reduction of Chemically Derived Graphene Oxide, Nature Chemistry 2, 581-587 (2010).

Gilje et al., A Chemical Route to Graphene for Device Applications, Nano Lett., vol. 7, No. 11, 2007, 3394-3398.

Gao et al., Hydrazine and Thermal Reduction of Graphene Oxide: Reaction Mechanisms, Product Structures, and Reaction Design, J. Phys. Chem.C 2010,114, 832-842.

Chapman, O. L. & Borden, G. W., Rearrangement in Borate Pyrolysis, Journal of Organic Chemistry, 1961, 26 (11). 4193-4195.

Singaram et al., Unusual Directive Effects in the Hydroboration of a Disubstituted Enamies. Conversion of a-Substituted Aldehydes to the Corresponding Alkenes and B-Amino Alcohols, Journal of Organic Chemistry, 1991, 56, 5691-5696.

http://www.appliedmst.com/products_mvd100.htm, downloaded on Jun. 1, 2012, 1 page.

http://www.sigmaaldrich.com/chemistry/chemistry-products.html?TablePage=16280330, downloaded on Jun. 11, 2012, 6 pages.

http://www.sigmaaldrich.com/chemistry/chemistry-products,html?TablePage=16280286, downloaded on Jun. 11, 2012, 3 pages.

Brown et al., Forty Years of hydride reductions, Tetrahedron, vol. 5, Issue 5, 1979, pp. 567-607.

Vath et al., Method for the Derivatization of Organic Compounds at the Sub-nanomole Level with Reagent Vapor, Fresenius Journal of Analytical Chemistry, 1988, 331, 248-252.

International Search Report and Written Opinion for application with No. PCT/U52011/051870 dated Nov. 7, 2011.

http://www.eaglabs.com/techniques/analytical_techniques/txrf.php, downloaded Jun. 12, 2012, 2 pages.

http://www.eaglabs.com/techniques/analytical_techniques/rbs.php, downloaded Jun. 12, 2012, 2 pages.

Richards et al., Low voltage backscattered electron imaging (<5 KV) using field emission scanning electron microscopy, Scanning Microscopy, 1999, 13, 55-60.

http://en.wikipedia.org/wiki/Stone-Wales_defect, dowloaded Sep. 11, 2012, 1 page.

Lusk, Mark T. & Carr, Lincoln D., Nano-Engineering Defect Structures on Graphene, http://arxiv.org/pdf/0712.1035, Sep. 23, 2008.

Liu et al., Graphene Oxidation: Thickness-Dependent Etching and Strong Chemical Doping, Nano Lett., vol. 8, 7, 2008, 1965-1970.

Romero et al., Adsorption of ammonia on graphene, Nanotechnology, 20, 2009, 245501.

http://en.wikipedia.org/wiki/Boron_tribromide, downloaded Jun. 13, 2012, 3 pages.

Wang et al., Atomic Layer Deposition of Metal Oxides on Pristine and Functionalized, http://www.stanford.edu/dept/chemistry/faculty/dai/group/Reprint/137.pdf, downloaded Sep. 4, 2012, 4 pages.

Salzano, F. J., The Behavior of Iodine in Graphite, Carbon 1964, vol. 2, 73-81.

http://serc.carleton.edu/research_education/geochemsheets/bse.html, downloaded Jun. 13, 2012, 2 pages.

Cretu et al., Migration and Localization of Metal Atoms on Strained Graphene, PRL 105, 2010, 196102.CRETU et al., Migration and Localization of Metal Atoms on Strained Graphene, PRL 105, 2010, 196102.

International Search Report and Written Opinion for application with No. PCT/US2011/051876 dated Jan. 12, 2011.

Bae et al., Roll-to-roll Production of 30-inch Graphene Films for Transparent Electrodes, Nature Nanotechnology. Published online: Jun. 20, 2010, 6 pages.

Li, X. et al., Supporting Online Material for Large-Area Synthesis of High-quality and uniform Graphene Films on Copper Foils, Science Express, May 7, 2009, 4 pages.

Yang et al., Fabrication of Graphene-Encapsulated OxideNanoparticles: Towards High-Performance Anode Materials for Lithium Storage, Angew. Chem. Int. Ed., 49, 2010, 8408-8411.

Vickery et al., Fabrication of Graphene—Polymer Nanocomposites with High-order Three-Dimensional Architectures, Adv. Mater., 21, 2009, 2180-2184.

Park, Sungjin and Ruoff, Rodney S., Chemical methods for the production of grapheries, Nature Nanotechnology, vol. 4, Apr. 2009, 217-224.

Wang, Z. et al., Direct Electrochemical Reduction of Single-Layer Graphen Oxide and Subsequent Functionalization with Glucose Oxidase, J. Phys. Chem. C, vol. 113, 32, 2009, 5 pages.

Li, X., et al., Highly Conducting Graphene Sheets and Langmuir-Blodgett films, Nature 538 Nanotechnology, vol. 3, Sep. 2008, 5 pages.

Ou, J. el al., Tribiology study of reduced graphene oxide sheets on silicon substratesynthesized via covalent assembly; Langmuir, 26, 2010, 15830-15838.

Li, H. et al., Aminosilane micropatterns on hydroxyl-terminated substrates: fabrication and applicatioin. Langmuir, 2010, 8 pages.

Li, X. et al., Highly conducting graphene sheets and Langmuir-Blodgett films, Nat Nanotech. 3, 2008, 538-542.

Gomez-Navgomez-Navarro, C. et al., Electronic transport properties of individual chemically reduced graphene oxide sheets, Nano Letter, 7, 2007, 3499-3503.

Mettevi, C. et al., A Review of chemical vapor deposition of graphene on copper, J. Mater. Chem., 2011, 11 pages.

Lopez, V. et al., Chemical vapor deposition repair of graphene oxide: a route to highly conductive graphene momolayers, Adv. Mater., 21, 2009, 4683-4686.

International Search Report and Written Opinion for application with No. PCT/US2011/051893 dated Nov. 4, 2011.

Lin J. et al., Molecular absorption and photodesorption in pristine and functionalized large-area graphene layers. Nanotechnology, vol. 22, 5, Aug. 2011, 6 pages.

Wang X. et al., N-Doping of Graphene Through Electrothermal reactions with Ammonia, Science, vol. 324, 768-771, May 8, 2009, 4 pages.

Jung N. et al., Charge Transfer Chemical Doping of Few Layer Graphenes: Charge Distribution and Band Gap Formation, Nano Lett., vol. 9, 12, Oct. 14, 2009, 4133-4137.

Banhart F. et al., Structural Defects in Graphene, ACSNANO, vol. 5, 1, published online Nov. 23, 2010, 26-41.

Schedin F. et al., Detection of individual gas molecules adsorbed on graphene, Nature Materials, vol. 6, Jul. 29, 2077, 652-655.

DE Office Action for related application in Germany No. 11 2011 100 116.9 based on International application No. PCT/US2011/051870, dated May 11, 2012, 8 pages.

(56) References Cited

OTHER PUBLICATIONS

"Glovebox" Wikipedia, accessed at http://web.archive.org/web/20100915042421/http://en.wikipedia.org/wiki/Glovebox , last modified on Aug. 6, 2010, pp. 1-2.

"Ideal Torsional Strengths and Stiffnesses of Carbon Nanotubes," accessed at http://web.archive.org/web/20110813190824/http://cms.mse.berkeley.edu/elif/Research/CNTs.html, accessed on Nov. 18, 2013, pp. 1-3.

Zhang, Y.H., et al., "Effects of Stone-Wales defect on the interactions between NH3, NO2 and graphene," Journal of Nanoscience and Nanotechnology, 2010, pp. 7347-7350, vol. 10, No. 1-4.

Liu, H. et al., "Chemical Doping of Graphene", Journal of Materials Chemistry, Mar. 2011, p. 3335-3345, vol. 21, 10.

Wu, Z. S., et al., "Doped Graphene Sheets as Anode Materials with Superhigh Rate and Large Capacity for Lithium Ion Batteries", American Chemical Society, 2011, 5463-5471.

* cited by examiner

300 A computer program product

302 A signal bearing medium.

304 At least one of

One or more instructions for at least partially altering a defect area in a layer on a substrate, wherein the layer includes graphene; or One or more instructions for receiving the layer, wherein the layer includes at least some defect areas in the graphene; or One or more instructions for heating the layer to a temperature in a range of about 80 degrees Celsius to about 150 degrees Celsius to produce a heated layer; or One or more instructions for exposing the heated layer to a first gas to produce a first exposed layer, wherein the first gas includes an amine; or One or more instructions for exposing the first exposed layer to a first inert gas to produce a second exposed layer; or

One or more instructions for exposing the second exposed layer to a second gas to produce a third exposed layer, wherein the second gas includes at least one of diborane, 9-borabicyclo(3.3.1)nonane, diisobutylaluminium hydride, or aluminum hydride; or One or more instructions for exposing the third exposed layer to a second inert gas to produce a fourth exposed layer; or One or more instructions for heating the fourth exposed layer to a temperature in a range of about 150 degrees Celsius to about 300 degrees Celsius.

| 306 A computer readable medium | 308 A recordable medium | 310 A communications medium |

GRAPHENE DEFECT ALTERATION

CROSS REFERENCE TO RELATED APPLICATIONS

This application is a 371 of International Application No. PCT/US11/051870 filed Sep. 16, 2011, the entirety of which is hereby incorporated by reference.

CROSS-REFERENCE TO RELATED APPLICATIONS

The present application is related to the following listed application(s): PCT Patent Application No. PCT/US2011/51876, entitled "GRAPHENE DEFECT DETECTION" naming Seth Miller as inventor, filed Sep. 16, 2011, which is currently co-pending; and PCT/US2011/51893, entitled "ALTERATION OF GRAPHENE DEFECTS", naming Seth Miller and Thomas Yager as inventors, filed Sep. 16, 2011, which is currently co-pending.

BACKGROUND

Unless otherwise indicated herein, the materials described in this section are not prior art to the claims in this application and are not admitted to be prior art by inclusion in this section.

Graphene is a material that generally may include a one atom thick layer of bonded carbon atoms. Graphene may be formed by growing carbon atoms on top of another material such as copper. The copper may be inserted into a quartz tube, heated, and annealed. A gas mixture of $CH_4$ and $H_2$ may then be flowed into the tube and the copper may then be cooled with flowing $H_2$ to form graphene.

SUMMARY

In some examples, a method for at least partially altering a defect area in a layer on a substrate is generally described. In some examples, the method may include receiving the layer, where the layer may include at least some graphene and at least some defect areas in the graphene. The method may further include exposing the layer to a gas where exposure of the layer to the gas may at least partially alter the defect area. The gas may include hydrogen and at least one of Boron (B), Aluminum (Al), Gallium (Ga), Indium (In) and/or Thallium (Tl).

In some examples, a system effective to alter a defect area in a layer on a substrate is generally described. In some examples, the system may include a chamber and a container arranged in communication with the chamber. The chamber may be configured effective to receive a layer, where the layer may include at least some defect areas in the graphene. The chamber and the container may be configured effective to expose the layer to a gas where exposure of the layer to the gas may be effective to at least partially alter the defect area. The gas may include hydrogen and at least one of Boron (B), Aluminum (Al), Gallium (Ga), Indium (In) and/or Thallium (Tl).

In some examples, a chamber effective to at least partially alter a defect area in a layer on a substrate is generally described. In some examples, the chamber includes a layer, where the layer may include at least some graphene. The chamber may further include a gas where exposure of the layer to the gas may be effective to at least partially alter the defect. The gas may include hydrogen and at least one of Boron (B), Aluminum (Al), Gallium (Ga), Indium (In) and/or Thallium (Tl).

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

all arranged according to at least some embodiments described herein.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to systems, methods, materials and apparatus related to graphene defect alteration.

Briefly stated, technologies are generally described for a method and system configured effective to alter a defect area in a layer on a substrate including graphene. An example method may include receiving and heating the layer to produce a heated layer and exposing the heated layer to a first gas to produce a first exposed layer, where the first gas may include an amine. The method may further include exposing the first exposed layer to a first inert gas to produce a second exposed layer and exposing the second exposed layer to a second gas to produce a third exposed layer where the second gas may include an alane or a borane. Exposure of the second exposed layer to the second gas may at least partially alter the defect area.

It will also be understood that any compound, material or substance which is expressly or implicitly disclosed in the specification and/or recited in a claim as belonging to a group or structurally, compositionally and/or functionally related compounds, materials or substances, includes individual representatives of the group and all combinations thereof.

Figure 1:
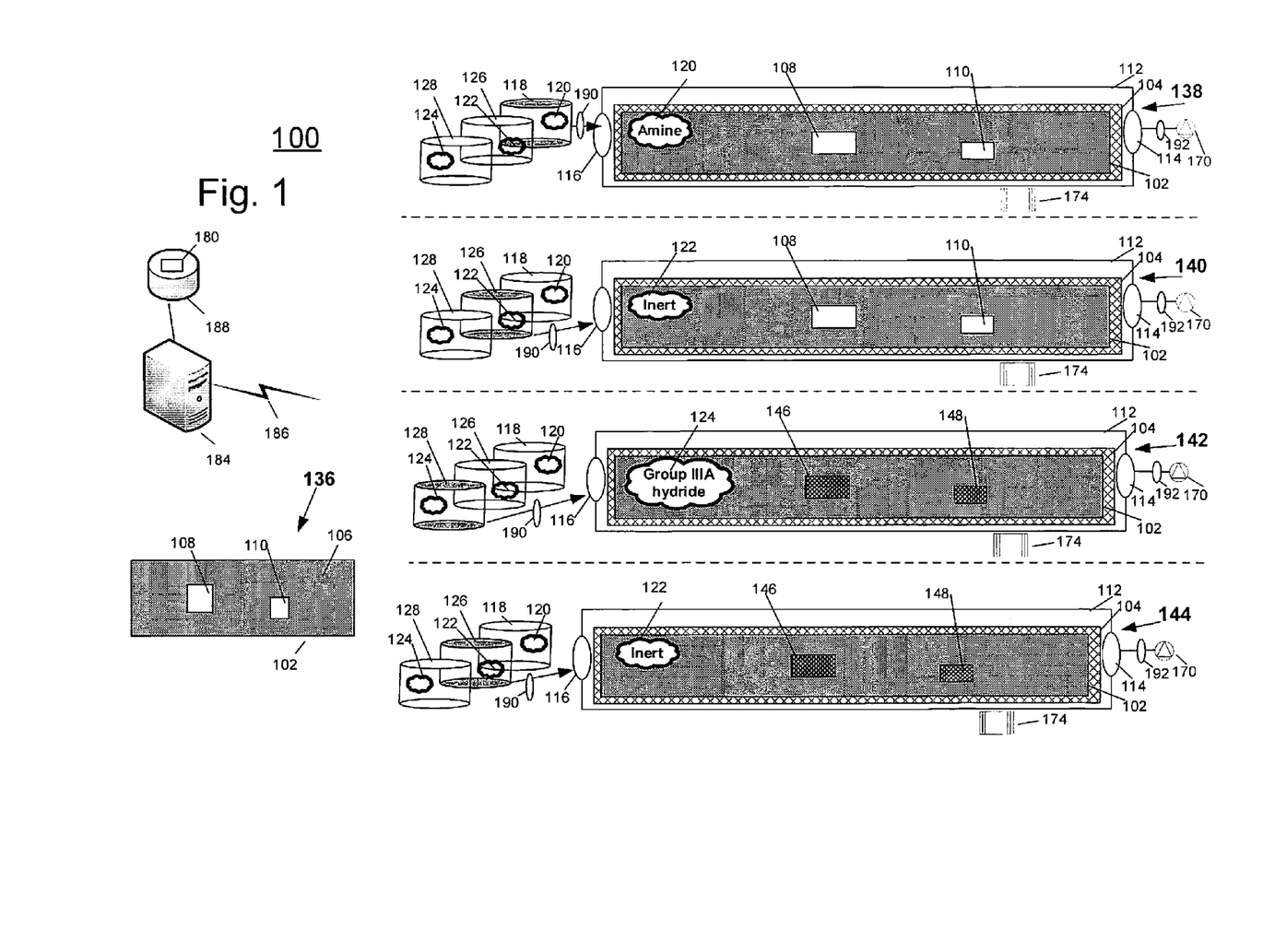
FIG. 1 illustrates an example system that can be utilized to implement graphene defect alteration.

FIG. 1 illustrates an example system that can be utilized to implement graphene defect alteration in accordance with at least some embodiments described herein. An example graphene defect alteration system 100 may include one or more chambers 112, one or more containers 118, 126, 128, one or more heaters 174 and/or one or more pumps 170. At least some of the elements of the defect alteration system 100 may be arranged in communication with a processor 184 through a communication link 186. In some examples, processor 184 may be adapted in communication with a memory 188 that may include instructions 180 stored therein. Processor 184 may be configured, such as by instructions 180, to control at least some of the operations/actions/functions described below.

During a graphene formation process, defects or defect areas may form on a layer 102 including graphene 106. Such defects may result from impurities in the graphene formation process. For example, chemical oxidation defects such as epoxides, carboxylic acid functionalities, alcohols, and/or ketones may form on graphene 106 which may degrade an operation of the graphene in some applications. For example, an electrical conductivity, chemical inertness or mechanical properties of the graphene may be decreased due to the presence of the defects. In an example, as shown at 136, a layer 102 on a substrate 104 including graphene 106 may include defect areas 108 and/or 110. As discussed in more detail below, layer 102 may be exposed to a group IIIA hydride material in the gas phase which may be effective to at least partially alter defects 108 and/or 110.

As shown at 138, layer 102 may be placed, such as by hand or machine, in a chamber 112. Layer 102 may be placed on a substrate 104. Chamber 112 may include ports 114, 116 and chamber 112 may be in communication with pump 170 such as through valve 192, heater 174 and/or containers 118, 126, and/or 128 such as through valve 190. Chamber 112 may be any appropriate chamber such as, for example, a chemical vapor deposition chamber or a molecular vapor deposition chamber, such as a MVD 100E chamber. Container 118, along with pump 170, may be configured (e.g., under control by a controller such as processor 184) effective to expose layer 102 to a gas 120. Gas 120 may include an amine such as pyrrolidine, piperidine, diethylamine, etc. In an example, layer 102 may be exposed to gas 120 at a pressure in a range between about 1 mtorr and about 1 atmosphere, such as 0.1 atmospheres, at a temperature in a range of about 35 degrees Celsius to about 150 degrees Celsius for a time interval in a range of about 30 seconds to about 10 minutes. As shown at 140, after exposure of layer 102 with gas 120, container 126, along with pump 170, may be configured to at least partially remove gas 120 from chamber 112. For example, these elements may be controlled to vacuum out chamber 112 and then pump gas 122 into chamber 112 through port 116 to push gas 120 out of chamber 114. For example, gas 122 may include an inert gas such as helium, neon, nitrogen, argon, krypton, xenon, radon, etc.

As shown at 142, container 128, along with pump 170, may be configured effective to expose layer 102 to a gas 124 where exposure of the defect areas to the gas may be effective to alter the defect areas into compounds more like graphene such as by increasing the number of carbon atoms participating in carbon-carbon double bonds, and produce altered defect areas 146, 148. Pump 170 may be configured to generate (or control) pressure in chamber 112 that may be less than one atmosphere such as, for example, in a range of about 1 mtorr to about 1 atmosphere, such as 0.1 atmospheres. Heater 174 may be configured (e.g., via a controller such as processor 184) to heat chamber 112 to a temperature in a range of about 80 degrees Celsius to about 250 degrees Celsius. Gas 124 may include hydrogen and a material selected from column IIIA of the Periodic Table of Chemical Elements such as Boron (B), Aluminum (Al), Gallium (Ga) Indium (In) and/or Thallium (Tl). For example, gas 124 may include a borane (B—H), or an alane (A-H), such as diborane ($B_2H_6$), diisobutylaluminium hydride ("DIBALH"), 9-Borabicyclo(3.3.1)nonane ("9-BBN"), and/or aluminum hydride ($AlH_3$). Exposure of a borane or alane gas to the defect areas 108, 110, may allow for the reduction of ketones, carboxylic acids, alcohols and/or epoxide defects in the graphene 106 of layer 102. Adding gas 124 into chamber 112 may increase a pressure in chamber 112 to about 0.1 atmospheres.

As shown at 144, after exposure of gas 124, container 126 and with pump 170 may be configured, such as via a controller such as processor 184 to at least partially remove gas 124 from chamber 112. For example, these elements may be controlled to vacuum out chamber 112 and then pump gas 122 into chamber 112 through port 116 to push gas 120 out of chamber 114. During the exposure of gas 122 at 144, heater 174 may be configured (e.g., via a controller such as processor 184) effective to heat chamber 112 to a temperature in a range of about 150 degrees Celsius to about 300 degrees Celsius at a pressure of in a range of about 1 mtorr to about 1 atmosphere, such as 0.1 atmospheres, for a time interval of about 1 minute to about 15 minutes. In an example, an exposure of gas 122 and/or heat from heater 174 may be effective to remove amine and/or borate on layer 102 that may be remaining from the processes described at 138 and/or 142.

In an example, focusing again at 138, heater 174 may be configured (e.g., via a controller such as processor 184) effective to heat layer 102 to a temperature in a range of about 80 degrees Celsius to about 150 degrees Celsius to reduce water in layer 102. Pump 170 may be configured effective to generate a vacuum in chamber 112, for example, a pressure in a range of 1 mtorr to about 1 atmosphere, such as 0.1 atmospheres. Container 118 may be effective to store an amine gas 120, such as piperidine, at a temperature in a range of about 15 degrees Celsius to about 25 degrees Celsius. Container 128 may be effective to store a borane gas 124, such as 9-BBN, at a temperature in a range of about 80 degrees Celsius to about 100 degrees Celsius at a pressure in a range of 1 mtorr to about 1 atmosphere, such as 0.1 atmospheres. Container 118 may be configured effective to expose piperidine gas 120 to layer 102 for a time interval of about 30 seconds to about 5 minutes.

At 140, container 126 may be configured (e.g., via a controller such as processor 184) effective to at least partially remove gas 120 from chamber 112. For example, these elements may be controlled to vacuum out chamber 112 and then pump gas 122, such as nitrogen, into chamber 112 through port 116 to push gas 120 out of chamber 114 for a time interval of about 30 seconds to about 3 minutes. In an example, these elements may operate at a pressure in a range between about 1 mtorr and about 1 atmosphere, such as 0.1 atmospheres, at a temperature in a range of about 35 degrees Celsius to about 150 degrees Celsius At 142, container 128 may be configured effective to expose borane gas 124 to layer 102 for a time interval that is in a range of about 2 minutes to about 10 minutes. At 144, container 126 may be configured effective to expose gas 122 to layer 102 for a time interval that is in a range of about 30 seconds to about 3 minutes. Heater 174 may be configured effective to heat chamber 112 to a temperature in a range of about 150 degrees Celsius to about 300 degrees Celsius.

In an example where defect areas 108, 110 include carboxylic acid functionalities, these acids may be reduced to aldehydes using a DIBALH gas or to alcohols using 9-BBN or DIBALH. Alcohols may react with borohydrides to produce borate esters which, in turn, may form alkenes when heated. In examples where defect areas 108, 110 include ketones, a reaction of the ketone with an amine, such as pyrrolidine, may form an enamine. Reaction of the enamine with 9-BBN may produce an amine-boron adduct. The adduct may then be removed through the application of heat to produce a desired alkene. In an example where defect areas 108, 110 include epoxides, a borane may be exposed to the epoxy to produce a borate ester. The borate ester, in turn, may be cleaved to produce a double bond in response to the application of heat.

Among other potential benefits, a system arranged in accordance with the present disclosure may be used to at least partially alter defect areas in a layer on a substrate. Defect areas in the layer may be altered even after graphene has been transferred from a location from where the graphene was grown. Graphene may be used in applications that may be sensitive to voids or cracks such as technologies where graphene is used in lithography as may occur in displays, microelectronic circuits, electronic interconnects, and optical applications. A system arranged in accordance with the present disclosure may be implemented without toxic and/or flammable materials. As a gas may be used, less impurities may be exposed to a layer than if a liquid or solvent were used. As the processes described herein can take place at relatively low temperatures below 300 degrees Celsius, there is less chance of damaging a graphene layer by generating a carbon vacancy. Described gases using boranes and alanes may be used to alter a defect area in graphene and the gases may avoid reacting with a substrate such as $SiO_2$.

Figure 2:
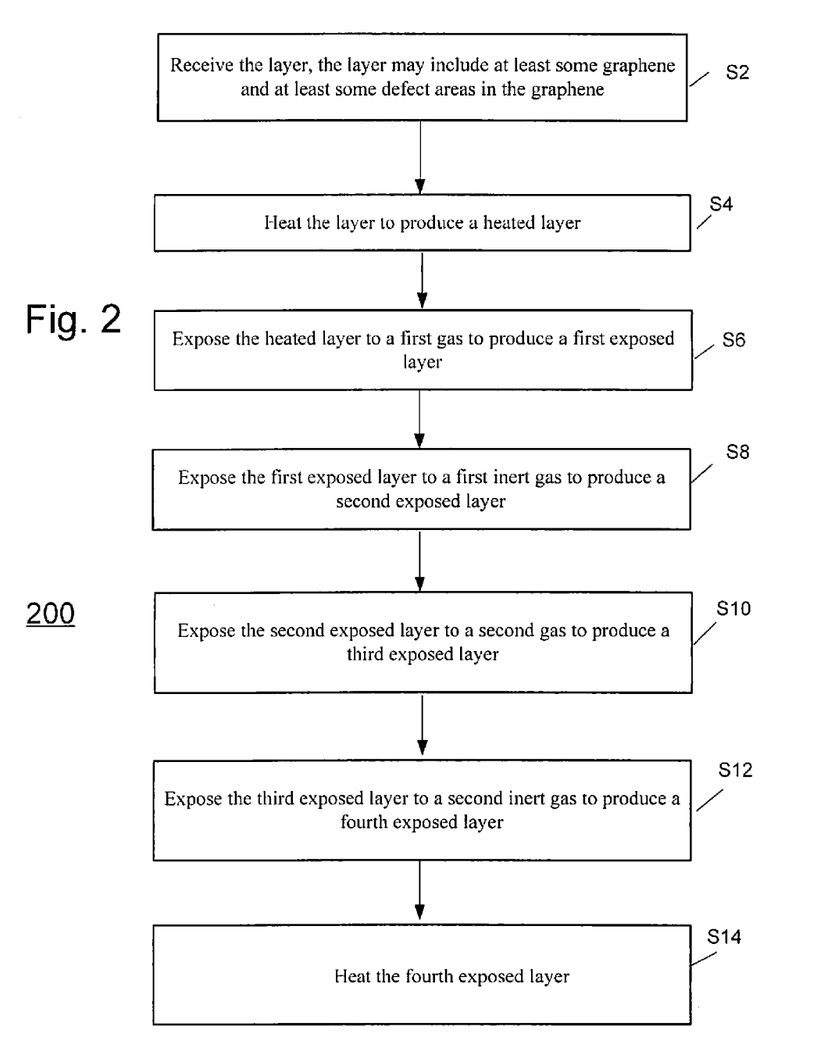
FIG. 2 depicts a flow diagram for an example process for implementing graphene defect alteration.

FIG. 2 depicts a flow diagram for an example process 200 for altering a defect area in a layer in accordance with at least some embodiments described herein. The process in FIG. 2 could be implemented using, for example, system 100 discussed above, where processor 184 may be adapted, via instructions, to control and facilitate the various processing operations through interfaces as will be further described with respect to FIG. 2. An example process may include one or more operations, actions, or functions as illustrated by one or more of blocks S2, S4, S6, S8, S10, S12 and/or S14. Although illustrated as discrete blocks, various blocks may be divided into additional blocks, combined into fewer blocks, or eliminated, depending on the desired implementation.

Process 200 may begin at block S2, "Receive the layer, the layer may include at least some graphene and at least some defect areas in the graphene." At block S2, a chamber may be configured effective to receive a layer including at least some graphene and at least some defect areas in the graphene.

Processing may continue from block S2 to block S4, "Heat the layer to produce a heated layer." At block S4, the chamber may be configured, such as via heater 174 under control by a controller such as processor 184, to heat the layer. For example, the layer may be heated to a temperature in a range of about 80 degrees Celsius to about 150 degrees Celsius.

Processing may continue from block S4 to block S6, "Expose the heated layer to a first gas to produce a first exposed layer." At block S6, the chamber along with valves and a container including the first gas, may be configured, such as, via control by a controller such as processor 184, to expose the heated layer to a first gas. In an example, the first gas may include an amine. In an example the first gas may include at least one of pyrrolidine, piperidine or diethylamine.

Processing may continue from block S6 to block S8, "Expose the first exposed layer to a first inert gas to produce a second exposed layer." At block S8, the chamber along with valves and a container including the inert gas, may be configured, such as via control by a controller such as processor 184, to expose the first exposed layer to a first inert gas.

Processing may continue from block S8 to block S10, "Expose the second exposed layer to a second gas to produce a third exposed layer." At block S10, the chamber along with valves and a container including the second gas, may be configured, such as via control by a controller such as processor 184, to expose the second exposed layer to a second gas. For example the second gas may include a borane, an alane, diborane, 9-borabicyclo(3.3.1)nonane, diisobutylaluminium hydride, or aluminum hydride.

Processing may continue from block S10 to block S12, "Expose the third exposed layer to a second inert gas to produce a fourth exposed layer." At block S12, the chamber along with valves and a container including the second inert gas may be configured, such as via control by a controller such as processor 184, to expose the third exposed layer to a second inert gas to produce a fourth exposed layer.

Processing may continue from block S12 to block S14, "Heat the fourth exposed layer." At block S14, the chamber may be configured, such as via heater 174 under control by controller such as processor 184, to heat the fourth exposed layer. In an example, the chamber may be configured to heat the fourth exposed layer to a temperature in a range of about 150 degrees to Celsius to about 300 degrees Celsius.

Figure 3:
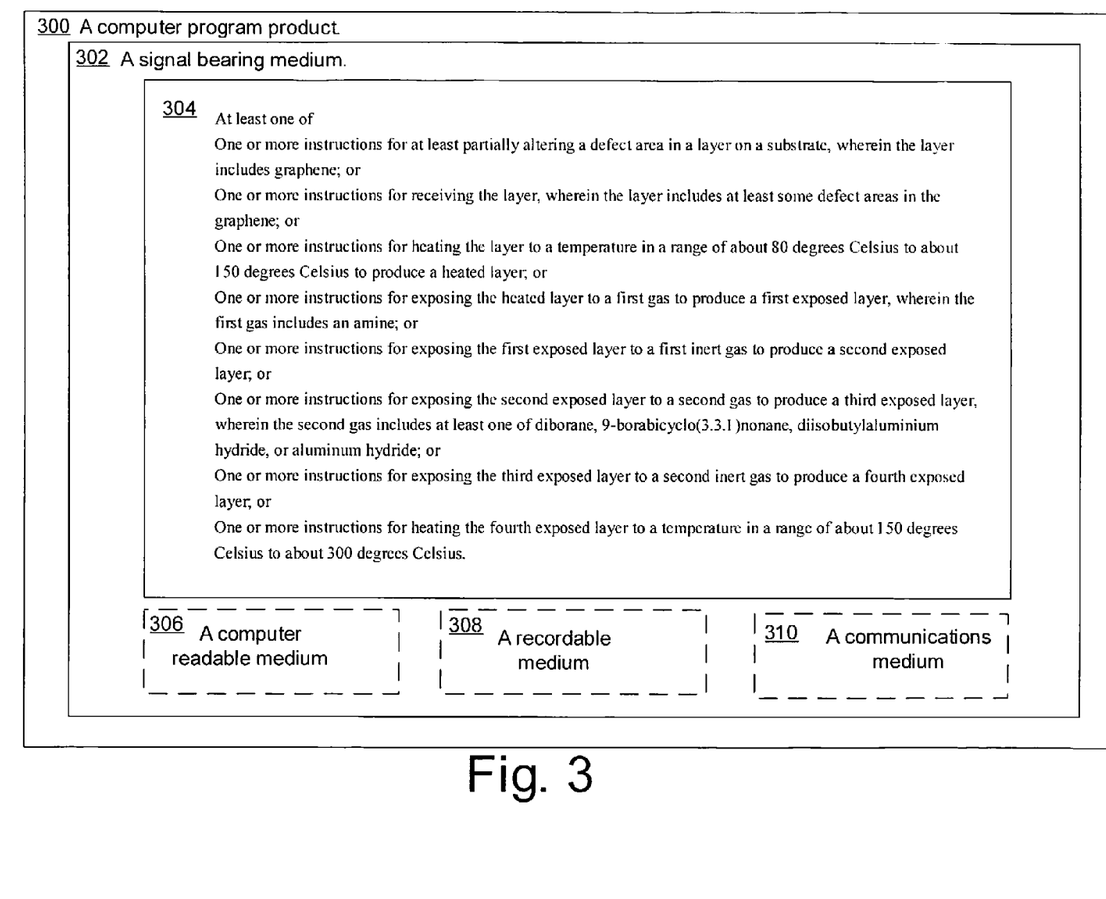
FIG. 3 illustrates a computer program product that can be utilized to implement graphene defect alteration.

FIG. 3 illustrates a computer program product that can be utilized to implement graphene defect alteration in accordance with at least some embodiments described herein. Program product 300 may include a signal bearing medium 302. Signal bearing medium 302 may include one or more instructions 304 that, when executed by, for example, a processor, may provide the functionality described above with respect to FIGS. 1-2. Thus, for example, referring to system 100, processor 184 may undertake one or more of the blocks shown in FIG. 3 in response to instructions 304 conveyed to the system 100 by medium 302.

In some implementations, signal bearing medium 302 may encompass a computer-readable medium 306, such as, but not limited to, a hard disk drive, a Compact Disc (CD), a Digital Video Disk (DVD), a digital tape, memory, etc. In some implementations, signal bearing medium 302 may encompass a recordable medium 308, such as, but not limited to, memory, read/write (R/W) CDs, R/W DVDs, etc. In some implementations, signal bearing medium 302 may encompass a communications medium 310, such as, but not limited to, a digital and/or an analog communication medium (e.g., a fiber optic cable, a waveguide, a wired communications link, a wireless communication link, etc.). Thus, for example, program product 300 may be conveyed to one or more modules of the system 100 by an RF signal bearing medium 302, where the signal bearing medium 302 is conveyed by a wireless communications medium 310 (e.g., a wireless communications medium conforming with the IEEE 802.11 standard).

Figure 4:
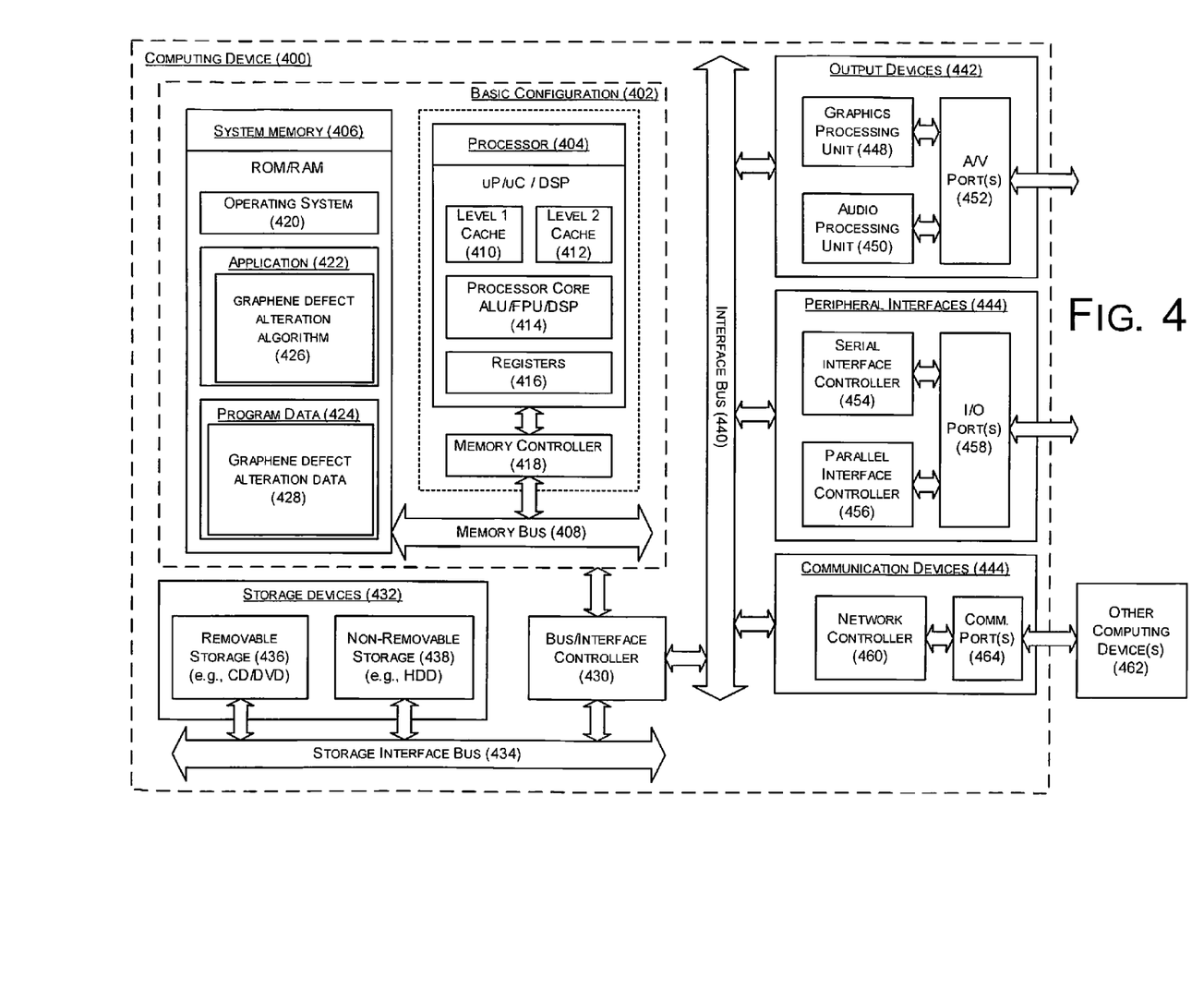
FIG. 4 is a block diagram illustrating an example computing device that is arranged to implement graphene defect alteration.

FIG. 4 is a block diagram illustrating an example computing device that is arranged to implement graphene defect alteration according to at least some embodiments described herein. In a very basic configuration 402, computing device 400 typically includes one or more processors 404 and a system memory 406. A memory bus 408 may be used for communicating between processor 404 and system memory 406.

Depending on the desired configuration, processor 404 may be of any type including but not limited to a microprocessor (μP), a microcontroller (μC), a digital signal processor (DSP), or any combination thereof. Processor 404 may include one more levels of caching, such as a level one cache 410 and a level two cache 412, a processor core 414, and registers 416. An example processor core 414 may include an arithmetic logic unit (ALU), a floating point unit (FPU), a digital signal processing core (DSP Core), or any combination thereof. An example memory controller 418 may also be used with processor 404, or in some implementations memory controller 418 may be an internal part of processor 404.

Depending on the desired configuration, system memory 406 may be of any type including but not limited to volatile memory (such as RAM), non-volatile memory (such as ROM, flash memory, etc.) or any combination thereof. System memory 406 may include an operating system 420, one or more applications 422, and program data 424. Application 422 may include a graphene defect alteration algorithm 426 that is arranged to perform the various functions/actions/operations as described herein including at least those described with respect to system 100 of FIGS. 1-3. Program data 424 may include graphene defect alteration data 428 that may be useful for implementing graphene defect alteration as is described herein. In some embodiments, application 422 may be arranged to operate with program data 424 on operating system 420 such that graphene defect alteration may be provided. This described basic configuration 402 is illustrated in FIG. 4 by those components within the inner dashed line.

Computing device 400 may have additional features or functionality, and additional interfaces to facilitate communications between basic configuration 402 and any required devices and interfaces. For example, a bus/interface controller 430 may be used to facilitate communications between basic configuration 402 and one or more data storage devices 432 via a storage interface bus 434. Data storage devices 432 may be removable storage devices 436, non-removable storage devices 438, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

System memory 406, removable storage devices 436 and non-removable storage devices 438 are examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by computing device 400. Any such computer storage media may be part of computing device 400.

Computing device 400 may also include an interface bus 440 for facilitating communication from various interface devices (e.g., output devices 442, peripheral interfaces 444, and communication devices 446) to basic configuration 402 via bus/interface controller 430. Example output devices 442 include a graphics processing unit 448 and an audio processing unit 450, which may be configured to communicate to various external devices such as a display or speakers via one or more A/V ports 452. Example peripheral interfaces 444 include a serial interface controller 454 or a parallel interface controller 456, which may be configured to communicate with external devices such as input devices (e.g., keyboard, mouse, pen, voice input device, touch input device, etc.) or other peripheral devices (e.g., printer, scanner, etc.) via one or more I/O ports 458. An example communication device 446 includes a network controller 460, which may be arranged to facilitate communications with one or more other computing devices 462 over a network communication link via one or more communication ports 464.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

Computing device 400 may be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 400 may also be implemented as a personal computer including both laptop computer and non-laptop computer configurations.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method for at least partially altering a defect area in a layer on a substrate, wherein the layer includes graphene, the method comprising:
   receiving the layer, wherein the layer includes at least some defect areas in the graphene; and
   exposing the layer to a gas, wherein the gas includes hydrogen and at least one of Boron (B), Aluminum (Al), Gallium (Ga), Indium (In) and/or Thallium (Tl), where exposure of the layer to the gas at least partially alters the defect area.

2. The method as recited in claim 1, wherein exposing the layer to the gas further comprises exposing the layer to a gas that includes a borane or an alane.

3. The method as recited in claim 1, wherein the gas is a first gas and the method further comprises:
   exposing the layer to a second gas effective to produce an exposed layer, wherein the second gas includes an amine; and thereafter
   exposing the exposed layer to the first gas.

4. The method as recited in claim 1, wherein the gas is a first gas and the method further comprises:
   exposing the layer to a second gas effective to produce an exposed layer, wherein the second gas includes an amine; and thereafter
   exposing the exposed layer to the first gas, wherein the first gas includes a borane or an alane.

5. The method as recited in claim 1, wherein the gas is a first gas and the method further comprises:
   exposing the layer to a second gas effective to produce an exposed layer, wherein the second gas includes at least one of pyrrolidine, piperidine and/or diethylamine; and thereafter
   exposing the exposed layer to the first gas, wherein the first gas includes a borane or an alane.

6. The method as recited in claim 1, wherein exposing the layer to the gas further comprises exposing the layer to a gas that includes at least one of diborane, 9-borabicyclo(3.3.1) nonarie, diisobutylaluminium hydride, and/or aluminum hydride.

7. The method as recited in claim 1, further comprising:
   exposing the layer to piperidine effective to produce an exposed layer; and thereafter
   exposing the exposed layer to 9-borabicyclo(3.3.1)nonane.

8. The method as recited in claim 1, wherein the gas is a first gas and the method further comprises:
   exposing the layer to a second gas effective to produce a first exposed layer, wherein the second gas includes an amine;
   exposing the first exposed layer to a first inert gas effective to produce a second exposed layer;
   exposing the second exposed layer to the first gas effective to produce a third exposed layer; and
   exposing the third exposed layer to a second inert gas.

9. The method as recited in claim 1, further comprising, after exposing the layer to the gas, heating the layer to a temperature in a range of about 150 degrees Celsius to about 300 degrees Celsius.

10. The method as recited in claim 1, wherein the gas is a first gas and the method further comprises:
- heating the layer to a temperature in a range of about 80 degrees Celsius to about 150 degrees Celsius effective to produce a heated layer;
- exposing the heated layer to a second gas effective to produce a first exposed layer, wherein the second gas includes an amine;
- exposing the first exposed layer to a first inert gas effective to produce a second exposed layer;
- exposing the second exposed layer to the first gas effective to produce a third exposed layer;
- exposing the third exposed layer to a second inert gas effective to produce a fourth exposed layer; and
- heating the fourth exposed layer to a temperature in a range of about 150 degrees Celsius to about 300 degrees Celsius.

11. The method as recited in claim 1, wherein the gas is a first gas and the method further comprises:
- heating the layer to a temperature in a range of about 80 degrees Celsius to about 150 degrees Celsius effective to produce a heated layer;
- exposing the heated layer to a second gas effective to produce a first exposed layer, wherein the second gas includes an amine;
- exposing the first exposed layer to a first inert gas effective to produce a second exposed layer;
- exposing the second exposed layer to the first gas effective to produce a third exposed layer, wherein the first gas includes an alane or a borane;
- exposing the third exposed layer to a second inert gas effective to produce a fourth exposed layer; and
- heating the fourth exposed layer to a temperature in a range of about 150 degrees Celsius to about 300 degrees Celsius.

12. The method as recited in claim 1, wherein the gas is a first gas and the method further comprises:
- heating the layer to a temperature in a range of about 80 degrees Celsius to about 150 degrees Celsius effective to produce a heated layer;
- exposing the heated layer to a second gas effective to produce a first exposed layer, wherein the second gas includes an amine;
- exposing the first exposed layer to a first inert gas effective to produce a second exposed layer;
- exposing the second exposed layer to the first gas effective to produce a third exposed layer, wherein the first gas includes at least one of diborane, 9-borabicyclo(3.3.1)nonane, diisobutylaluminium hydride, and/or aluminum hydride;
- exposing the third exposed layer to a second inert gas effective to produce a fourth exposed layer; and
- heating the fourth exposed layer to a temperature in a range of about 150 degrees Celsius to about 300 degrees Celsius.

* * * * *

UNITED STATES PATENT AND TRADEMARK OFFICE
CERTIFICATE OF CORRECTION

| | | |
|---|---|---|
| PATENT NO. | : 8,747,947 B2 | Page 1 of 1 |
| APPLICATION NO. | : 13/377971 | |
| DATED | : June 10, 2014 | |
| INVENTOR(S) | : Miller | |

It is certified that error appears in the above-identified patent and that said Letters Patent is hereby corrected as shown below:

On the Title Page

On Page 2, in Item [56], under "OTHER PUBLICATIONS", in Column 1, Line 16, delete "Enamies." and insert -- Enamines. --, therefor.

On Page 2, in Item [56], under "OTHER PUBLICATIONS", in Column 1, Line 31, delete "andWritten" and insert -- and Written --, therefor.

On Page 2, in Item [56], under "OTHER PUBLICATIONS", in Column 1, Line 40, delete "dowloaded" and insert -- downloaded --, therefor.

On Page 2, in Item [56], under "OTHER PUBLICATIONS", in Column 2, Line 30, delete "Graphen" and insert -- Graphene --, therefor.

On Page 2, in Item [56], under "OTHER PUBLICATIONS", in Column 2, Line 35, delete "Tribiology" and insert -- Tribology --, therefor.

On Page 2, in Item [56], under "OTHER PUBLICATIONS", in Column 2, Line 36, delete "substratesynthesized" and insert -- substrate synthesized --, therefor.

On Page 2, in Item [56], under "OTHER PUBLICATIONS", in Column 2, Line 39, delete "applicatioin." and insert -- application. --, therefor.

On Page 2, in Item [56], under "OTHER PUBLICATIONS", in Column 2, Line 48, delete "momolayers," and insert -- monolayers, --, therefor.

In the Claims

Column 10, Line 48, Claim 6, delete "nonarie," and insert -- nonane, --, therefor.

Signed and Sealed this
Twenty-eighth Day of October, 2014

Michelle K. Lee
*Deputy Director of the United States Patent and Trademark Office*